United States Patent
Pirchheim et al.

(10) Patent No.: US 10,781,623 B2
(45) Date of Patent: Sep. 22, 2020

(54) DEVICE AND VEHICLE FOR THE CONTACTLESS ACTUATION OF AN ADJUSTABLE VEHICLE PART

(71) Applicant: BROSE FAHRZEUGTEILE GMBH & CO. KOMMANDITGESELLSCHAFT, BAMBERG, Bamberg (DE)

(72) Inventors: Florian Pirchheim, Bamberg (DE); Jonas Reich, Ebern (DE)

(73) Assignee: Brose Fahrzeugteile GmbH & Co. Kommanditgesellschaft, Bamberg, Bamberg (DE)

( * ) Notice: Subject to any disclaimer, the term of this patent is extended or adjusted under 35 U.S.C. 154(b) by 65 days.

(21) Appl. No.: 15/629,983

(22) Filed: Jun. 22, 2017

(65) Prior Publication Data

US 2017/0284149 A1 Oct. 5, 2017

Related U.S. Application Data

(63) Continuation of application No. PCT/EP2015/079718, filed on Dec. 15, 2015.

(30) Foreign Application Priority Data

Dec. 22, 2014 (DE) .......................... 10 2014 018 924

(51) Int. Cl.
*E05F 15/73* (2015.01)
*G01D 5/24* (2006.01)
(Continued)

(52) U.S. Cl.
CPC ............... *E05F 15/73* (2015.01); *B60J 5/101* (2013.01); *B60R 25/2054* (2013.01);
(Continued)

(58) Field of Classification Search
USPC ....................................... 296/146.4
See application file for complete search history.

(56) References Cited

U.S. PATENT DOCUMENTS 9,464,921 B2 10/2016 Van Gastel
2013/0234733 A1* 9/2013 Lange ................. B60R 25/2045
324/658

(Continued)

FOREIGN PATENT DOCUMENTS

DE 102010049400 A1 4/2012
DE 102012100960 A1 8/2013
(Continued)

*Primary Examiner* — Joseph D. Pape
*Assistant Examiner* — Dana D Ivey
(74) *Attorney, Agent, or Firm* — Laurence A. Greenberg; Werner H. Stemer; Ralph E. Locher

(57) ABSTRACT

A device for the contactless actuation of an adjustable vehicle part. The device has a capacitive proximity sensor with at least one elongated sensor electrode, and a body part to which the proximity sensor is indirectly or directly fastened. The body part in turn is or can be mounted on the vehicle in a specific mounting position. The sensor electrode extends obliquely relative to a lower edge of the body part in such a way that it is in an exact or at least approximately horizontal position with respect to its longitudinal extension when in the mounting position.

5 Claims, 3 Drawing Sheets

(51) Int. Cl.
*B60J 5/10* (2006.01)
*H03K 17/955* (2006.01)
*B60R 25/20* (2013.01)

(52) U.S. Cl.
CPC ......... *G01D 5/2405* (2013.01); *H03K 17/955* (2013.01); *E05Y 2900/532* (2013.01); *H03K 2217/960755* (2013.01)

(56) References Cited

U.S. PATENT DOCUMENTS

| | | | |
|---|---|---|---|
| 2013/0234828 A1* | 9/2013 | Holzberg | B60R 25/2054 340/5.72 |
| 2014/0032055 A1 | 1/2014 | Holzberg et al. | |
| 2014/0070920 A1* | 3/2014 | Elie | H03K 17/945 340/5.72 |
| 2016/0245671 A1* | 8/2016 | Wuerstlein | G01N 27/221 |

FOREIGN PATENT DOCUMENTS

| | | |
|---|---|---|
| DE | 102012102060 A1 | 9/2013 |
| EP | 2689976 A1 | 1/2014 |
| WO | 2013182466 A1 | 12/2013 |

\* cited by examiner

DEVICE AND VEHICLE FOR THE CONTACTLESS ACTUATION OF AN ADJUSTABLE VEHICLE PART

CROSS-REFERENCE TO RELATED APPLICATION

This is a continuation application, under 35 U.S.C. § 120, of copending international application No. PCT/EP2015/079718, filed Dec. 15, 2015, which designated the United States; this application also claims the priority, under 35 U.S.C. § 119, of German patent application No. 10 2014 018 924.4, filed Dec. 22, 2014; the prior applications are herewith incorporated by reference in their entirety.

BACKGROUND OF THE INVENTION

Field of the Invention

The invention concerns a device for the contactless actuation of an adjustable vehicle part that contains a body cladding part or an outer cladding part that is or can be mounted on the vehicle and a proximity sensor that is indirectly or directly attached thereto. The invention further concerns a vehicle containing the device.

Modern vehicles are often fitted with sensors that enable the contactless displacement of vehicle parts. For example, a user of a vehicle enables the contactless actuation (i.e. opening or closing) of a vehicle door by such a sensor. Such sensors are in particular provided for the motorized tailgates of motor vehicles, so that the user of a vehicle can cause the opening or closing of the tailgate by a suitable leg movement without having to put down a load being held in the hands ("Hands-free Access"). Such a contactless tailgate switch is known from published, non-prosecuted German patent application DE 10 2010 049 400 A1, for example.

Capacitively operating proximity sensors are often used as sensors for the detection of an actuation command. Typically, a capacitive proximity sensor contains two sensor electrodes and an electronics unit, each of which is connected to the sensor electrodes via corresponding feed lines. The proximity sensor is often indirectly or directly attached to the inside of a rear bumper of the vehicle. In this case, the proximity sensor is sometimes disposed in a longitudinal side section of the bumper relative to the vehicle. The side section of the bumper often contains a lower edge extending at an angle relative to the horizontal. It has been shown that the reliability of the proximity sensor is often adversely affected with the proximity sensor in a side section of such a design in the installation position.

SUMMARY OF THE INVENTION

It is the object of the invention to provide a device of the aforementioned type for the contactless actuation of an adjustable vehicle part that is particularly reliable to operate (i.e. fail-safe).

The device according to the invention for the contactless actuation of an adjustable vehicle part contains at least one capacitive proximity sensor that for its part contains at least one elongated sensor electrode for the detection of an actuation command produced by proximity to the proximity sensor. The sensor electrode is formed here by an elongated electrical conductor, for example in the form of a round conductor or a flat conductor. In particular, in an advantageous embodiment the sensor electrode is formed by the outer conductor of a coaxial cable or of a similar cable without an inner conductor. The proximity sensor preferably comprises two elongated sensor electrodes, wherein particularly preferably one of the sensor electrodes is formed by a flat conductor (i.e. a conductor with a band-shaped flat conductor geometry), whereas the second sensor electrode is formed by a round conductor. It is however also possible within the scope of the invention that both sensor electrodes are of the same construction.

Furthermore, the device contains a body cladding part or an outer cladding part that is or can be mounted in a defined installation position on the vehicle. The proximity sensor is indirectly or directly attached to the body cladding part or outer cladding part (referred to in brief below as a "supporting part"). The proximity sensor can thus either be directly mounted on the supporting part, or alternatively the proximity sensor can also be attached to an interposed mounting part (intermediate support), which for its part is in turn attached to the supporting part.

In one advantageous embodiment of the invention, the supporting part is formed by a—in particular rear—(vehicle) bumper. The proximity sensor is in this case preferably attached to the inside of the bumper (again indirectly or directly). However, within the scope of the invention the supporting part can for example also be formed by a door sill or another part of outer vehicle cladding.

According to the invention, with the proximity sensor in the installed state on the supporting part, the sensor electrode extends at an angle to a lower edge of the supporting part. The oblique position is dimensioned here so that with the supporting part in the installation position on the vehicle, the sensor electrode is oriented exactly or at least approximately horizontally regarding the longitudinal extent thereof. In other words, owing to the oblique arrangement on the supporting part, the sensor electrode extends at least approximately parallel to the (flat) ground on which the vehicle is standing. If the proximity sensor contains two or more sensor electrodes, then the electrodes are in particular mounted on the supporting part so as to be spaced apart and parallel to each other. Accordingly, each of the sensor electrodes is oriented at an angle to the lower edge of the supporting part or parallel to the ground. In particular, an edge of the supporting part that faces the ground on which the vehicle is standing with the supporting part in the intended installation position is referred to as the lower edge.

The invention is based on the consideration that in modern vehicles supporting parts to which sensor electrodes are attached sometimes comprise lower edges that are inclined relative to the horizontal. This is particularly true for the side sections of bumpers. Conventionally, a sensor electrode is regularly placed on the supporting part parallel to the lower edge. Disadvantageously however, it has been found that such an arrangement often results in proximity sensor detection errors. For example, it can happen that an incidence of an approach to a first end of the sensor electrodes is interpreted as an actuation command, whereas an incidence of an approach to an opposite end of the sensor electrodes erroneously does not trigger an actuation command. The invention removes this disadvantage by providing that the sensor electrode is deliberately laid out of parallel to the lower edge of the supporting part, so that the sensor electrode (with the supporting part in the intended installation position) is at least approximately at the same distance from a (flat) surface on which the vehicle is standing over the entire length thereof. The result of this on the other hand is that a body part (in particular a foot of the user of a vehicle), which is moved towards the proximity sensor as intended to produce an actuation command, is always at approximately the same distance from the sensor electrode regardless of the position along the length (at which point) of the sensor electrode such an approach occurs. It is thus advantageously ensured that similar approach events at different points along the longitudinal extent of the sensor electrode result in the same sensor signals, whereby the risk of detection errors is advantageously reduced.

The sensor electrode with suitable dimensions is in particular referred to as "oriented approximately horizontally" if the distance from the ground varies by no more than 20 mm over the length of the sensor electrode. For an at least approximately linear sensor electrode, the result of the dimensioning is a maximum permissible angle of attack (maximum angle of attack) relative to the horizontal depending on the length of the sensor electrode. It is thus preferably provided that the sensor electrode is inclined relative to the horizontal by no more than an angle that is smaller than the maximum angle of attack.

In a preferred embodiment of the invention, the supporting part is formed by a bumper, wherein the proximity sensor is attached to a side section of the bumper. In this case, the device preferably contains two proximity sensors, wherein the sensors are disposed on the two opposing side sections of the bumper.

The adjustable vehicle part is preferably a tailgate of the vehicle. It is however generally also conceivable that the adjustable vehicle part is a different vehicle door, for example a side door, in particular a sliding door, or an engine hood.

Other features which are considered as characteristic for the invention are set forth in the appended claims.

Although the invention is illustrated and described herein as embodied in a device for the contactless actuation of an adjustable vehicle part, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
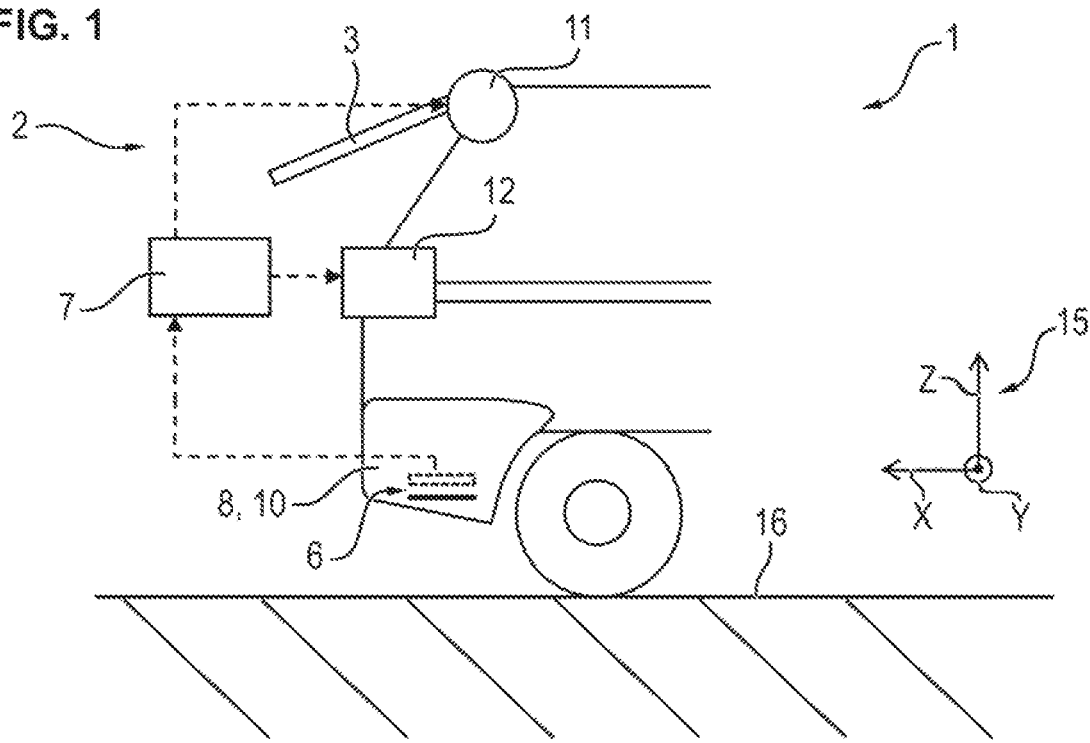
FIG. 1 is a basic schematic representation a motor vehicle with a bumper to which a proximity sensor for a contactless actuation of a tailgate of the motor vehicle is attached according to the invention.

Mutually corresponding parts and variables are always provided with the same reference characters in all figures.

Referring now to the figures of the drawings in detail and first, particularly to FIG. 1 thereof, there is shown a rear part of a (motor) vehicle 1 that is represented in a side view. The vehicle 1 contains a device 2 for the contactless actuation of a motorized vehicle part, in this case a tailgate 3 thereof. The device 2 contains capacitive proximity sensors 6. Furthermore, the device 2 contains a control and analysis unit 7. A rear bumper 8 is attached to the vehicle 1. The proximity sensors 6 are each disposed in a side section 10 on the bumper 8 that bounds the bumper 8 in the lateral direction of the vehicle. The bumper 8 thus forms (in the sense of the nomenclature introduced above) a supporting part of the device according to the invention. The position of the proximity sensors 6 is represented here for one of the side sections 10 and thereby only in a rough simplified schematic form.

An operating demand or actuation command detected by one of the proximity sensors 6 is output to the control and analysis unit 7, whereupon the control and analysis unit 7 actuates a flap drive 11 and/or a door lock 12 of the vehicle 1 to open or close the tailgate 3 according to the operating demand.

A Cartesian vehicle coordinate system 15 for orientation is indicated in FIG. 1. The X-axis of the coordinate system denotes the longitudinal direction of the vehicle X here and is oriented parallel to the ground 16 on which the vehicle 1 is standing. The Y direction of the vehicle coordinate system 15 indicates the lateral direction of the vehicle Y and is likewise oriented parallel to the ground 16. In the representation according to FIG. 1, the Y-axis points out of the plane of the drawing. The longitudinal direction of the vehicle X and the lateral direction of the vehicle Y thus span a horizontal plane. Finally, the Z-axis of the coordinate system points in the direction of a vertical Z of the vehicle and is thus erected perpendicularly on the ground 16 and the parallel horizontal plane. The directions introduced above are also used below to characterize the spatial orientation of components in the intended installation position thereof in the vehicle 1.

Figure 2:
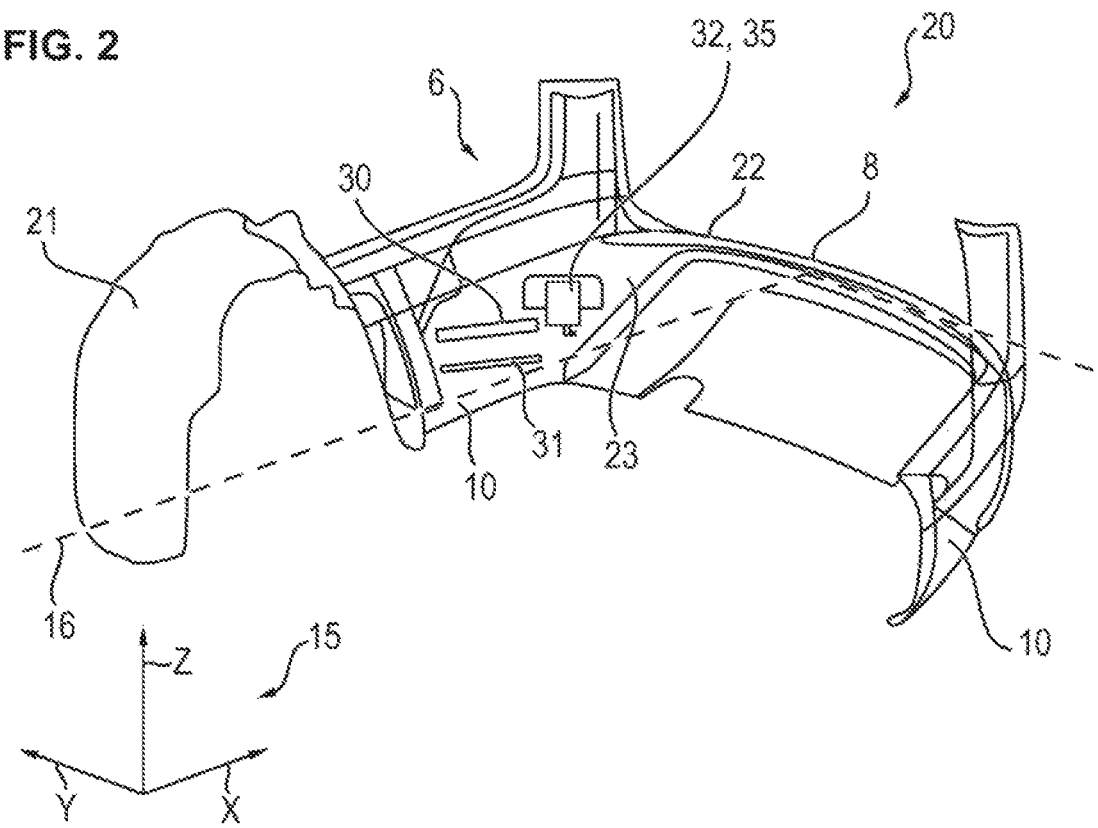
FIG. 2 is a diagrammatic, perspective view of a body assembly that contains the bumper according to FIG. 1.

FIG. 2 shows a body assembly 20. The body assembly 20 contains a plurality of body parts, in this case specifically on the one hand the bumper 8 according to FIG. 1, and on the other hand a wheel arch 21. The bumper 8 is in turn divided into the two side sections 10 and an interposed rear section 22. The body assembly 20 is shown with the direction of view approximately in the longitudinal direction of the vehicle X according to FIG. 1. Accordingly, in FIG. 2 an inner side 23 of the bumper 8 facing the vehicle 1 is to be seen in the intended installed state of the body assembly 20 or of the bumper 8 on the vehicle 1. The bumper 8 is formed by a thin-walled, three-dimensional molded plastic part. In the installed state, the bumper 8 partly envelops the vehicle 1 to the rear and to the side. In FIG. 2 it is shown that the proximity sensors 6 are disposed in the two mutually opposite side sections 10 of the bumper 8. One of the proximity sensors 6 is shown here purely as an example, wherein the opposite (not shown) proximity sensor is correspondingly implemented diametrically opposite. The proximity sensors 6 are mounted directly on an inner side 23 of the bumper here. The bumper 8 is thus used in the exemplary embodiment as a supporting component on which the proximity sensors 6 are mounted. In an alternative embodiment, it is provided by contrast that the proximity sensors 6 are placed on a supporting component that is separate from the bumper 8, wherein for its part the supporting component—for example formed by a flat molded part—is attached to the inner side 23 of the bumper.

As can be seen from the representation, the proximity sensor 6 contains a first elongated (sensor) electrode 30, a second elongated (sensor) electrode 31 and an electronics unit 32. Connecting lines that connect the two electrodes 30, 31 to the electronics unit 32 are conventionally implemented and are not shown here for clarity. In an alternative embodiment of the invention, the function of the control and analysis unit 7 is integrated within the electronics unit 32. In this case, the control and analysis unit 7 is a component of the proximity sensor 6.

In the exemplary embodiment shown, the first (upper) electrode 30 is formed by a flat conductor with a flat strip-shaped conductor track, whereas the second (lower) electrode 31 is formed by a cylindrical, flexible round electrode in the form of an insulated round conductor. The round conductor is in particular a solid wire, a braided conductor or the outer conductor of a coaxial cable. The inner conductor usually provided with a coaxial cable is in this case optionally omitted or replaced by a core of non-conducting material, in particular plastic.

The electronics unit 32 includes analysis electronics (not shown explicitly) as an essential component that preferably in turn contains a microcontroller. The analysis electronics are accommodated in a housing 35. Plug connectors that are not represented further are formed on the housing 35. The plug connectors are used on the one hand to contact the connecting lines and on the other hand for connecting a control line on the vehicle side, via which the electronics unit 32 communicates with the control and analysis unit 7, and via which the electrical energy required for operation is delivered to the electronics unit 32.

In the exemplary embodiment represented here, the electronics unit 32 is bolted to the inner side 22 of the bumper by lugs formed on the housing 35. It can however, also be attached to the bumper 8 in a different way, for example by gluing, riveting or welding.

Each of the electrodes 30, 31 contains on each longitudinal end a plug connection that is used to contact the connecting line. The electrodes 30, 31, as well as the connecting lines, are clipped onto the inner side 22 of the bumper using further latching elements that are not represented here. Alternatively, the electrodes 30, 31 can even be glued to the inner side 22 of the bumper.

Figure 3:
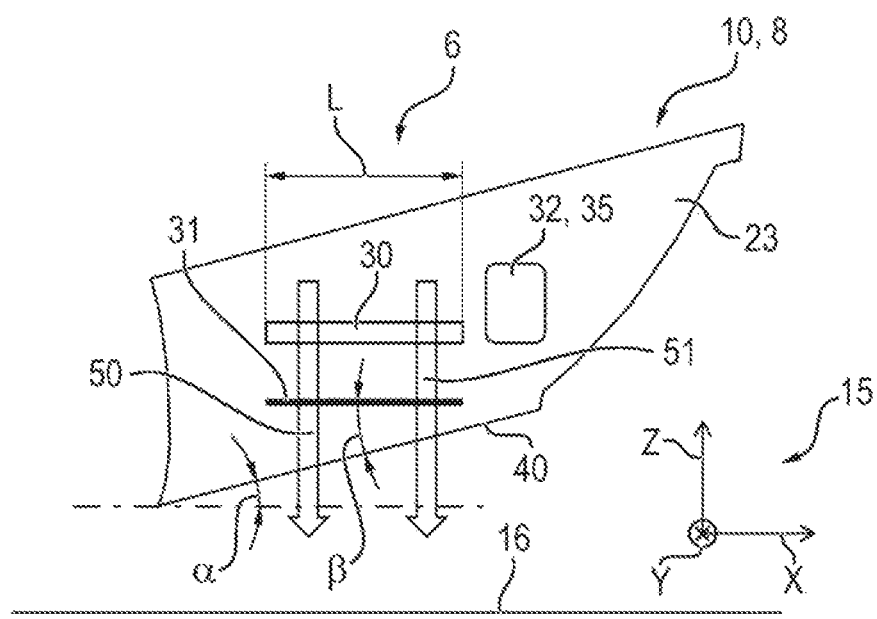
FIG. 3 is a schematic individual representation a side section of the bumper according to FIG. 2, on the inside of which two sensor electrodes of the proximity sensor are installed.

The arrangement of the electrodes 30, 31 according to the invention relative to the side section 10 is described in detail below using FIG. 3. FIG. 3 shows the side section 10 according to FIG. 2 with a view of the inner side 23 of the bumper, wherein the wheel arch 21 (not shown) connects on the left according to the representation, whereas the rear section 21 (also not shown) connects on the right. The side section 10 contains a lower edge 40 that is inclined to the horizontal plane or to the ground 16 at an angle α of about 13.5° in this case. In this case, the rear end of the lower edge 40 on the vehicle side is disposed further from the ground 16 than the front end.

As can be seen from FIG. 3, the two electrodes 30, 31 are disposed spaced apart and parallel to each other on the inner side 23 of the bumper. In the exemplary embodiment, both electrodes 30, 31 have about the same length L. Each of the electrodes 30, 31 is at least approximately installed linearly (i.e. not curved). Here each of the electrodes 30, 31 encloses an angle β with the lower edge 40 of the side section 10. The angle β is in this case dimensioned such that each of the electrodes 30, 31 extends exactly or at least approximately parallel to the ground 16 if the bumper 8 is mounted as intended on the vehicle 1. The angle β thus coincides in magnitude at least approximately with the angle α.

Figure 4:
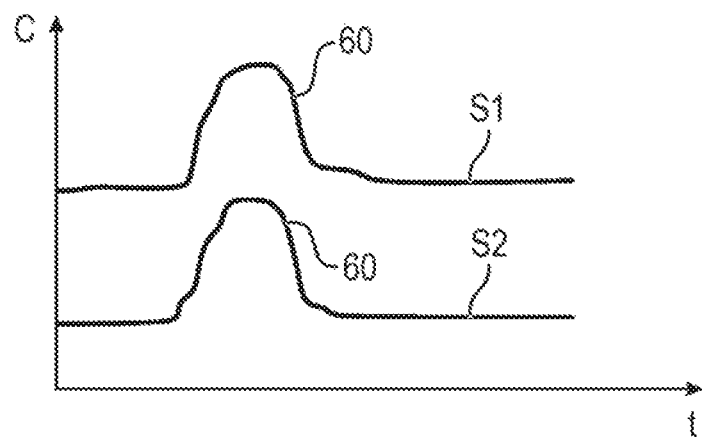
FIG. 4 is a graph showing a time profile of signals produced by the sensor electrodes for an incidence of an approach to a first location according to FIG. 3.
Figure 5:
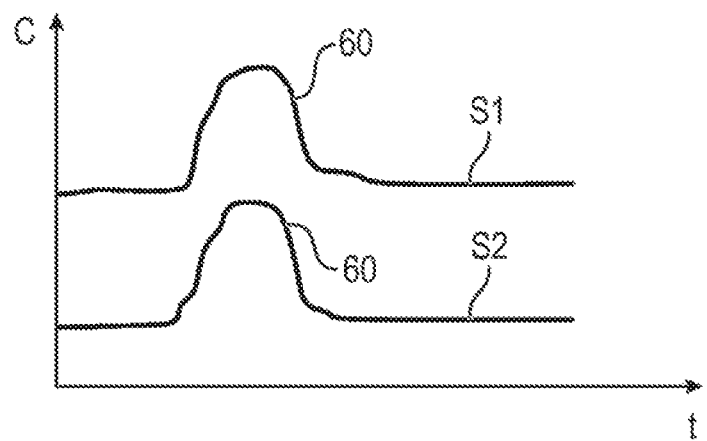
FIG. 5 is a graph showing a time profile of the signals produced by the sensor electrodes for an incidence of an approach to a second location according to FIG. 3.

In FIG. 3, in addition a first location 50 and a second location 51 are each characterized by an arrow. For each location 50, 51, a time profile of signals is shown in FIG. 4 or FIG. 5 in each case, such as is produced on the electrodes 30, 31 in the event of an intended foot movement at the first location 50 or the second location 51. During the intended foot movement, a foot of a user of a vehicle is extended in a typically short "kicking motion" below the bumper 8, wherein the foot penetrates both into a detection space of the first electrode 30 and into a detection space of the second electrode 31.

In the diagrams according to FIG. 4 and FIG. 5, each one of the measures of capacitance C detected at the respective sensor electrodes 30, 31 is represented as a function of time t. A first curve represents a proximity signal S1 produced at the first electrode 30 in each case here, whereas a second curve represents a proximity signal S2 produced by the second electrode 31 in each case. It can be seen from the diagrams that the individual signal profiles are at least approximately identical, both in the comparison of the two electrodes 30, 31 with each other (signal profile S1 compared to signal profile S2), and also in the comparison of the two locations 50, 51 with each other (FIG. 4 compared to FIG. 5). In particular, a change of the same magnitude of the measure of capacitance C is detected in signal pulses 60 in the respective proximity signals S1, S2. It is clear from this that owing to the arrangement according to the invention of the electrodes 30, 31, in the event of the proximity of a body part to the electrodes 30, 31 an at least approximately equal attenuation of the proximity sensor 6 is always achieved at each location of the electrodes 30, 31. A different attenuation over the length of the electrodes 30, 31, as is detected in the case of a conventional manner of installation of the electrodes 30, 31 parallel to the lower edge 40, is advantageously prevented owing to the arrangement according to the invention of the electrodes.

Figure 6:
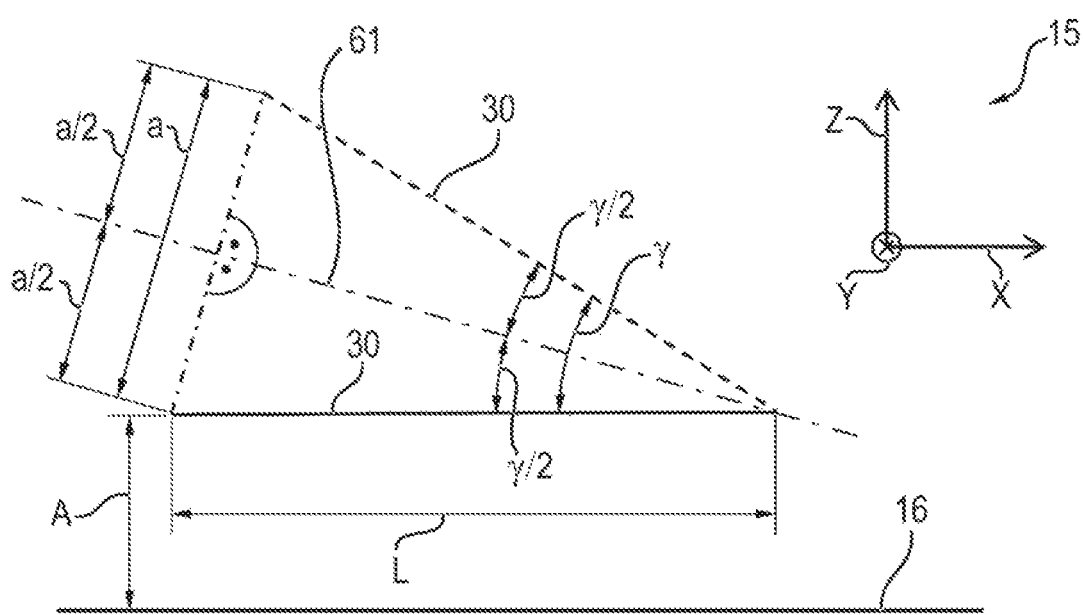
FIG. 6 is a schematic view of the sensor electrodes according to FIG. 3 which represents a maximum permissible angle of attack of a sensor electrode relative to the horizontal.

In FIG. 6, the electrode 30 is shown once in a horizontal installation position (shown in solid) and once in a position that is inclined to the maximum extent relative to the horizontal installation position (shown dashed). With suitable dimensioning, the electrode 30 is installed such that in the installed state a distance A of the electrode 30 from the ground 16 varies over the length L of the electrodes 30 by no more than a difference in distance a of 20 mm here. As can be seen from FIG. 6, a maximum angle of attack γ, at which the electrode 30 should deviate most from the horizontal plane, at least approximately results from the maximum difference in distance a. The angle of attack γ is calculated for a predetermined length L of the electrode 30 according to equation. 1. To derive equation 1, an angle bisector 61 relative to the angle of attack γ is additionally plotted in FIG. 6.

$$\gamma = 2 \cdot \sin^{-1}\left(\frac{a}{2 \cdot L}\right) \qquad \text{Eq. 1}$$

Expressed in another way, the invention is in particular used if the angle α at which the lower edge 40 is inclined relative to the horizontal (see FIG. 3) exceeds the maximum permissible angle of attack γ.

The subject matter of the invention is not limited to the previously described exemplary embodiments. Rather, further embodiments of the invention can be derived from the previous description by the person skilled in the art. In particular, the described individual features of the invention and the design variants thereof can also be combined with each other in other ways.

The following is a summary list of reference numerals and the corresponding structure used in the above description of the invention:

1 (motor) vehicle
2 device
3 tailgate
6 proximity sensor
7 control and analysis unit
8 bumper
10 side section
11 flap drive
12 door lock
15 vehicle coordinate system
16 ground
20 body assembly
21 wheel arch
22 rear section
23 inner side of bumper
30 (sensor) electrode
31 (sensor) electrode
32 electronics unit
35 housing
40 lower edge
50 location
51 location
60 signal pulse
61 angle bisector
A distance
a difference in distance
C measure of capacitance
L length
S1, S2 proximity signal
X longitudinal direction of the vehicle
Y lateral direction of the vehicle
Z vehicle vertical
α angle
β angle
γ angle of attack

The invention claimed is:

1. A device for contactless actuation of an adjustable vehicle part of a vehicle, the device comprising:
  a capacitive proximity sensor having at least one elongated sensor electrode;
  a cladding part being mounted in a defined installation position on the vehicle such that a lower edge of said cladding part is inclined with respect to a horizontal plane or ground, said capacitive proximity sensor is indirectly or directly attached to said cladding part, said cladding part having a side section extending in a longitudinal direction of the vehicle; and
  said elongated sensor electrode extending at an angle to said lower edge of said cladding part such that said elongated sensor electrode is oriented horizontally along a longitudinal extent of said elongated sensor electrode when in an installation position and said proximity sensor is attached to said side section of said cladding part and extending in the longitudinal direction.

2. The device according to claim 1, wherein:
  said cladding part is a bumper of the vehicle; and
  said proximity sensor is indirectly or directly attached to an inside of said cladding part.

3. The device according to claim 1, wherein a distance of said elongated sensor electrode from ground on which the vehicle is standing varies by no more than a difference in distance of 20 mm over a length of said elongated sensor electrode.

4. The device according to claim 1, wherein said elongated sensor electrode is one of two sensor electrodes that are attached to said cladding part exactly or at least approximately parallel to each other in respect of a longitudinal extent of said sensor electrodes.

5. A vehicle, comprising:
  an adjustable vehicle part;
  a device for contactless actuation of said adjustable vehicle part of the vehicle, said device containing a capacitive proximity sensor having at least one elongated sensor electrode;
  a cladding part being mounted in a defined installation position on the vehicle such that a lower edge of said cladding part is inclined with respect to a horizontal plane or ground, said capacitive proximity sensor is indirectly or directly attached to said cladding part, said cladding part having a side section extending in a longitudinal direction of the vehicle; and
  said elongated sensor electrode extending at an angle to said lower edge of said cladding part such that said elongated sensor electrode is oriented horizontally along a longitudinal extent of said elongated sensor electrode when in an installation position and said proximity sensor is attached to said side section of said cladding part and extending in the longitudinal direction.

* * * * *